(12) United States Patent
Yonezu et al.

(10) Patent No.: US 8,723,291 B2
(45) Date of Patent: May 13, 2014

(54) SEMICONDUCTOR INTEGRATED CIRCUIT

(75) Inventors: Toshiaki Yonezu, Tokyo (JP); Takeshi Iwamoto, Tokyo (JP); Shigeki Obayashi, Tokyo (JP); Masashi Arakawa, Tokyo (JP); Kazushi Kono, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/592,949

(22) Filed: Aug. 23, 2012

(65) Prior Publication Data

US 2013/0049166 A1    Feb. 28, 2013

Related U.S. Application Data

(63) Continuation of application No. 11/836,609, filed on Aug. 9, 2007, now abandoned.

(30) Foreign Application Priority Data

Aug. 11, 2006 (JP) .................................. 2006-219370
Feb. 9, 2007 (JP) .................................. 2007-30263

(51) Int. Cl.
*H01L 23/62* (2006.01)

(52) U.S. Cl.
USPC .................. 257/529; 257/E23.002; 257/209; 257/550

(58) Field of Classification Search
USPC .......................................... 257/209, 529, 550
See application file for complete search history.

(56) References Cited

U.S. PATENT DOCUMENTS

| | | | |
|---|---|---|---|
| 5,780,918 A | 7/1998 | Aoki | |
| 6,222,244 B1 | 4/2001 | Arndt et al. | |
| 6,295,721 B1 * | 10/2001 | Tsai | 29/623 |
| 6,486,526 B1 * | 11/2002 | Narayan et al. | 257/529 |
| 6,566,238 B2 | 5/2003 | Brintzinger et al. | |

(Continued)

FOREIGN PATENT DOCUMENTS

| | | |
|---|---|---|
| CN | 1581479 A | 2/2005 |
| JP | 2006-73947 | 9/2004 |
| JP | 2005-39220 A | 2/2005 |
| JP | 2005-57186 A | 3/2005 |

OTHER PUBLICATIONS

Japanese Office Action dated Jun. 26, 2012 corresponding to Japanese Patent Application No. 2007-030263.

(Continued)

*Primary Examiner* — David Vu
*Assistant Examiner* — Jonathan Han
(74) *Attorney, Agent, or Firm* — Miles & Stockbridge P.C.

(57) ABSTRACT

A semiconductor integrated circuit which can perform reliable relief processing using an electric fuse. The semiconductor integrated circuit includes a fuse wiring, a first electrode pad, a second electrode pad, a pollution-control layer, and a first via hole wiring and a second via hole wiring. The fuse wiring is cut by current exceeding a predetermined value. A first electrode pad is connected to one side of a fuse wiring, a second electrode pad is connected to the other of a fuse wiring, a pollution-control layer is formed in the upper layer and the lower layer of the fuse wiring via an insulating layer. In the fuse wiring, second via hole wiring of a pair is formed in the outside of a first via hole wiring so that the first the via hole wiring is surrounded.

4 Claims, 11 Drawing Sheets

(56) References Cited

U.S. PATENT DOCUMENTS

| | | | |
|---|---|---|---|
| 6,872,648 B2* | 3/2005 | Friese et al. | 438/601 |
| 7,282,751 B2 | 10/2007 | Ueda | |
| 2002/0017704 A1* | 2/2002 | Yajima | 257/665 |
| 2004/0262710 A1 | 12/2004 | Ueda | |
| 2005/0029620 A1 | 2/2005 | Ueda | |

OTHER PUBLICATIONS

Korean Office Action dated May 9, 2013, issued in counterpart Korean Patent Application No. 10-2007-0059218.

Taiwanese Office Action dated Apr. 15, 2013, issued in counterpart Taiwan Patent Application No. 096119137.

* cited by examiner

SEMICONDUCTOR INTEGRATED CIRCUIT

CROSS-REFERENCE TO RELATED APPLICATIONS

This application is a continuation of application Ser. No. 11/836,609 filed Aug. 9, 2007 now abandoned. The present application also claims priority from Japanese patent application No. 2006-219370 filed on Aug. 11, 2006, and No. 2007-30263 filed on Feb. 9, 2007, the content of which is hereby incorporated by reference into this application.

FIELD OF THE INVENTION

The present invention is an invention concerning a semiconductor integrated circuit, and especially relates to the semiconductor integrated circuit provided with a fuse.

DESCRIPTION OF THE BACKGROUND ART

By forming a fuse in a semiconductor integrated circuit, the fuse was cut, the value of resistance was adjusted and relief processing, such as transposing a defective element to a normal element, was performed. And generally the laser fuse cut by the laser beam irradiation from the outside was used as a fuse conventionally used for relief processing.

However, since laser irradiation was done and fuse cutting was done from the outside, the laser fuse cannot perform relief processing after a mold. Since memory space's doing realization of high-capacity in a memory or SOC (System On a Chip) and SIP (System in Package) are used, in order to improve the yield at an early stage, relief processing is needed after a mold. However, since the laser irradiation from the outside cut with the laser fuse, relief processing was able to be performed only on the bare wafer.

The electric fuse which sends current and is cut and which is relievable even if it is on site or after molding, naturally on wafer is used for the semiconductor integrated circuit. Since it cut by doing laser irradiation from the outside, the trimming dedicated device and the relief processing step were required of the laser fuse. However, since it can trim immediately after a test using a circuit tester with an electric fuse, it is newly unnecessary in trimming equipment or a relief processing step. This electric fuse is described to Patent Reference 1 or Patent Reference 2.

[Patent Reference 1] Japanese Unexamined Patent Publication No. 2005-39220

[Patent Reference 2] Japanese Unexamined Patent Publication No. 2005-57186

SUMMARY OF THE INVENTION

When using an electric fuse for a semiconductor integrated circuit, it is necessary to minimize the area of a relieving circuit including an electric fuse as much as possible. In order to generate current required for cutting of an electric fuse especially, a power supply circuit is required. In order to minimize the area of this power supply circuit as much as possible, it is necessary to minimize current required for cutting.

When an electric fuse is cut, there is a problem of a crack occurring from a cut section, or the wiring material of a cut section dispersing, polluting a periphery, and reducing the reliability of a semiconductor integrated circuit.

Then, the present invention aims at offering the semiconductor integrated circuit which can perform reliable relief processing using an electric fuse.

The solving means concerning the present invention comprises a fuse wiring cut by passing beyond a predetermined current value, a first electrode pad connected to one side of the fuse wiring, a second electrode pad connected to the other of the fuse wiring, a pollution-control layer formed in an upper layer and a lower layer of the fuse wiring via an insulating layer, a first via hole wiring of a pair which is formed via the insulating layer to a side surface of the fuse wiring, connects with the pollution-control layer, and surrounds the fuse wiring, and a second via hole wiring of a pair formed in an outside of the first via hole wiring to the fuse wiring so that the first via hole wiring may be surrounded.

A semiconductor integrated circuit described in the present invention is provided with the first via hole wiring of the pair which connects with a pollution-control layer and surrounds a fuse wiring, and the second via hole wiring of a pair formed so that a first via hole wiring may be surrounded. When an electric fuse is cut, it prevents the wiring material of a cut section dispersing and polluting a periphery, and has the effect of improving the reliability of a semiconductor integrated circuit. In a semiconductor integrated circuit described in the present invention, since the influence of the up-and-down layer on the fuse wiring at the time of fuse cutting can be suppressed by arranging a pollution-control layer, the up-and-down layer concerned can be wired and reduction of chip size is attained.

DETAILED DESCRIPTION OF THE PREFERRED EMBODIMENTS (Embodiment 1)

Figure 1:
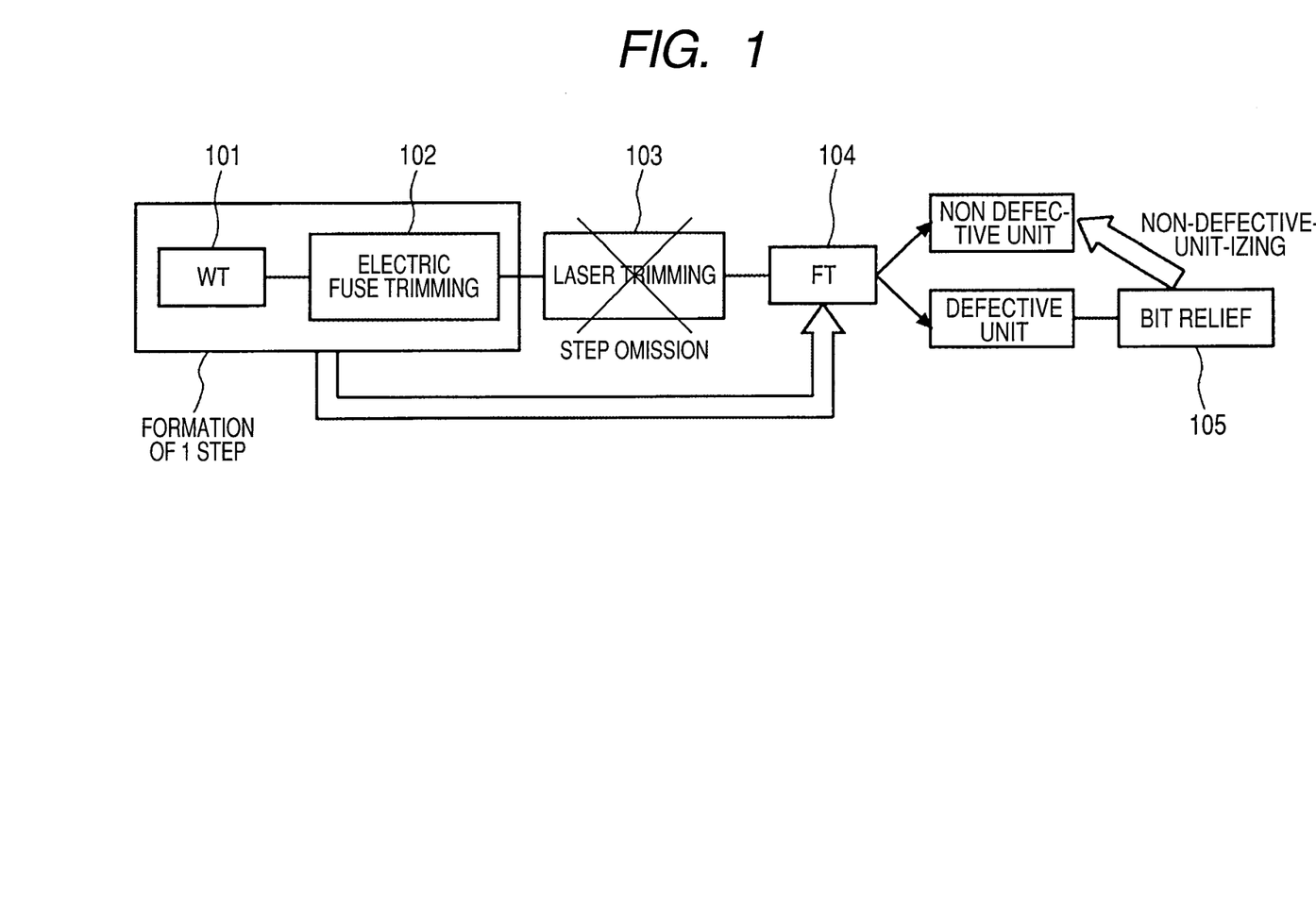
FIG. 1 is a block diagram explaining the usage use of the electric fuse used for a semiconductor integrated circuit.

First, the usage use of the electric fuse used for a semiconductor integrated circuit is explained using FIG. 1. FIG. 1 is the drawing which expressed the processing after wafer test (WT) 101 schematically. In FIG. 1, a test and relief processing can be completed at one step by performing electric fuse trimming 102 after wafer test (WT) 101. On the other hand, it is necessary to perform laser trimming 103 of a separated process after wafer test (WT) 101, and, in the case of the semiconductor integrated circuit using a laser fuse, two steps are needed for performing test and relief processing. Therefore, one step can be skipped by using an electric fuse for a semiconductor integrated circuit. That is, by combining an electric fuse and BIST (built in self-test), it becomes possible to build a self repair test, and the cost of a test can be reduced.

In FIG. 1, when a non defective unit and a defective unit are sorted out by final test (FT) 104 done after the mold of a semiconductor integrated circuit, and it is an electric fuse, a defective unit can be made non-defective-unit by bit relief processing 105. That is, the relief after burn-in etc. is attained by using an electric fuse for a semiconductor integrated circuit, and productivity improves.

The wiring blowout type electricity fuse is used in the semiconductor integrated circuit concerning this embodiment. Generally polysilicon was used for this electric fuse as a fuse wiring material until now. Since the frequency in use of metal wiring will increase from now on, Cu, Al, Ti, Ta, etc. come to be used as a fuse wiring material. So, this embodiment explains the electric fuse which used Cu as a fuse wiring material. Even if it uses fuse wiring materials other than Cu, an effect equivalent to the effect described below can be acquired.

Figure 2:
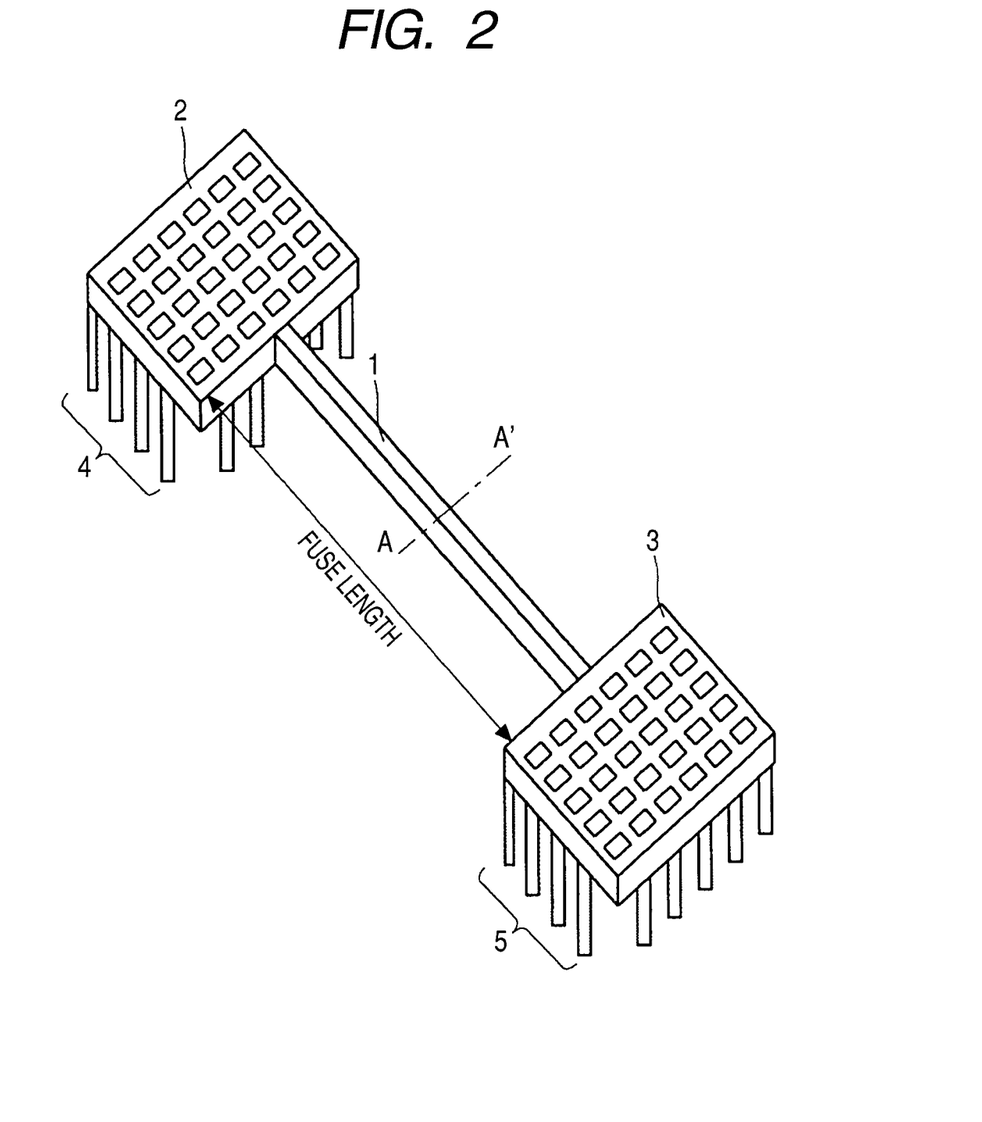
FIG. 2 is a perspective view of the electric fuse concerning Embodiment 1 of the present invention.
Figure 3:
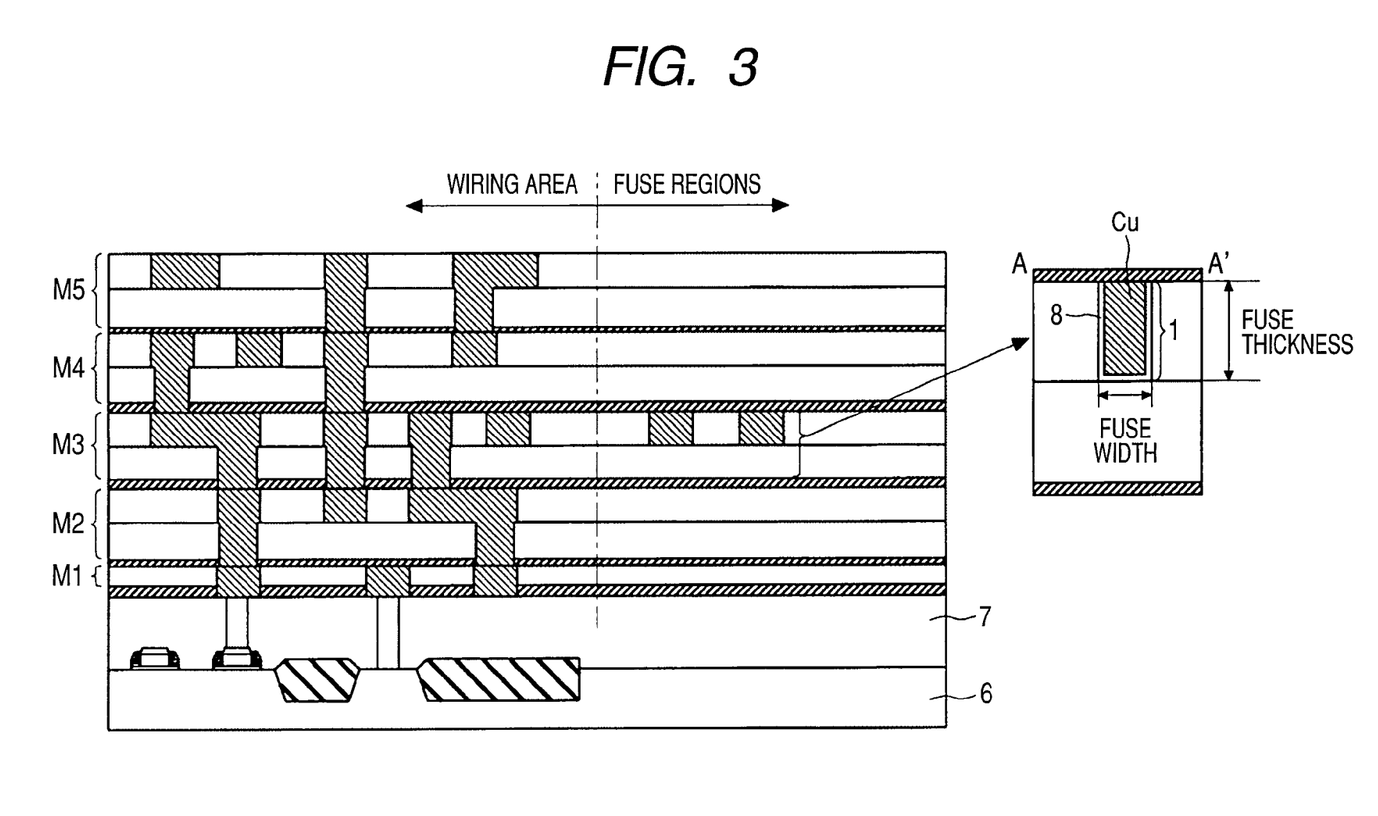
FIG. 3 is a cross-sectional view of the semiconductor integrated circuit concerning Embodiment 1 of the present invention.

The perspective view of the electric fuse related to this embodiment at FIG. 2 is shown, and the cross-sectional view of the semiconductor integrated circuit which includes the electric fuse related at this embodiment at FIG. 3 is shown. In FIG. 2, electrode pad 2 for feeding power is connected to one side of fuse wiring 1, and electrode pad 3 for GND supply is connected to the other. In order to electrically connect this electrode pad 2 for feeding power and power supply circuit (not shown), a plurality of plugs 4 for feeding power are formed in electrode pad 2 for feeding power. In order to electrically connect electrode pad 3 for GND supply, and a power supply circuit (not shown), a plurality of plugs 5 for GND supply are formed in electrode pad 3 for GND supply. Fuse length is the length of fuse wiring 1 from electrode pad 2 for feeding power to electrode pad 3 for GND supply.

A required thing is designing the structure of the blown-out type electricity fuse which is 100% of a relief rate, and makes cutting current the minimum from a viewpoint of the structural design of a fuse. However, fuse wirings 1 which can be stably cut with the minimum cutting current differ according to fuse width, fuse thickness, material, etc. In fuse wiring 1 shown in FIG. 2, fuse width was set as 0.12 μm, fuse thickness was set as 250 nm, and material was set as Cu.

With the electric fuse concerning this embodiment, in order to always generate a cutting part in the central part of fuse wiring 1, the number of plugs 4 for feeding power and the number of plugs 5 for GND supply are made into the same number. Each cross section of plug 4 for feeding power and plug 5 for GND supply is the same. Hereby, when applying current and cutting at an electric fuse, the heat of fuse wiring 1 generated in application of current escapes from plug 4 for feeding power, and plug 5 for GND supply uniformly, and it can cut in the mostly central part of fuse wiring 1.

However, the number of plugs 4 for feeding power and the number of plugs 5 for GND supply are not necessarily restricted to the same number. When the total of a contact cross section with electrode pad 2 for feeding power of a plurality of plugs 4 for feeding power is the same as the total of a contact cross section with electrode pad 3 for GND supply of a plurality of plugs 5 for GND supply, it is good.

The electric fuse concerning this embodiment is formed in a fine layer in the semiconductor integrated circuit with which a global layer is about 1000 nm, a semi global layer is about 350 nm, and a fine layer is about 200 nm. In this embodiment, although the fine layer is about 200 nm, generally the layer about 300 nm-about 100 nm is called fine layer. With the cross-sectional view shown in FIG. 3, the fine layer from M1 layer to M5 layer is illustrated. And although fuse wiring 1 may be formed in any M1 layer to M5 layer shown in FIG. 3, it is formed in M3 layer by this embodiment.

In FIG. 3, the wiring layer from M1 layer to M5 layer is formed via TEOS layer 7 on Si substrate 6. And it separates by a SiCN layer between each wiring layer, and separates by SiOC between each wiring in the same wiring layer. In FIG. 3, the enlarged view of fuse wiring 1 corresponding to the A-A' surface of FIG. 2 is illustrated. With this enlarged view, barrier metal layer 8 is formed between fuse wiring 1 of Cu, and SiOC of an insulating film. This barrier metal layer 8 is formed by Ta or TaN.

In order to cut fuse wiring 1, it is necessary to change the material of fuse wiring 1 from a solid to a liquid. That is, it is necessary to send current through fuse wiring 1 and to raise the temperature of fuse wiring 1 self at the lowest to the melting point (for a melting point to be about 1100° C., when material is Cu) of the material concerned.

Figure 4:
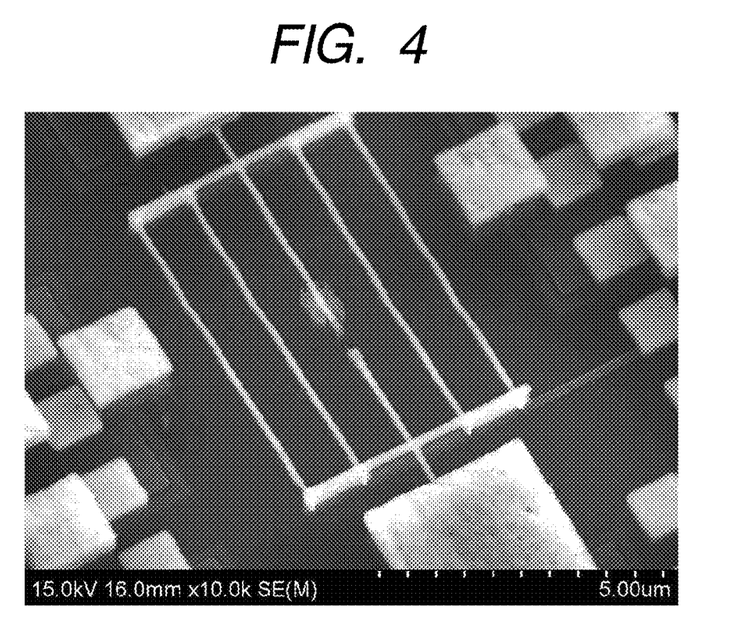
FIG. 4 is the SEM photography of the electric fuse concerning Embodiment 1 of the present invention.

Next, the SEM (Scanning Electron Microscope) photography of an electric fuse is shown in FIG. 4. A state that fuse wiring 1 of middle was cut and the deposit part of the wiring material has spread near the concerned cut section is shown by FIG. 4. When the deposit part generated at the time of cutting of this fuse wiring 1 occurs near electrode pad 2 for feeding power, or the electrode pad 3 for GND supply, there is concern which produces the bad influence of short-circuiting with other adjoining wirings. Therefore, in the electric fuse concerning this embodiment, the number of plug 4 for feeding power connected to electrode pad 2 for feeding power and the number of plug 5 for GND supply connected to electrode pad 3 for GND supply were made into the same number, and the cut section is controlled to occur in the central part of fuse wiring 1.

The simulation of the heat generated in fuse wiring 1 is done by the case where the number of plug 4 for feeding power and the number of plug 5 for GND supply are made into the same number, and the case where it is made a different number. As a result, when the number of plug 4 for feeding power and the number of plug 5 for GND supply are made into the same number, compared with the case where it is made a different number, the portion which reaches beyond a melting point becomes short within fuse wiring 1. And it turned out that the portion more than melting point temperature concentrates on the central part of fuse wiring 1.

Figure 5:
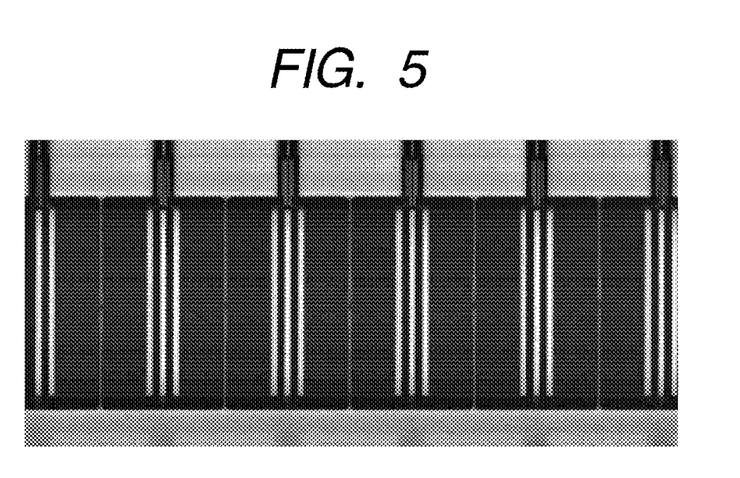
FIG. 5 is the SEM photography in which a plurality of electric fuses concerning Embodiment 1 of the present invention are arranged.

In the semiconductor integrated circuit concerning this embodiment, as shown in the SEM photography of FIG. 5, a plurality of electric fuses are formed. In FIG. 5, although a plurality of electric fuses are located in a line with the horizontal direction, the present invention may be structure which is not restricted to this but is located in a line with a longitudinal direction. Several of the electric fuse shown in FIG. 5 are cut in the central part of the fuse wiring.

(Embodiment 2)

Figure 6:
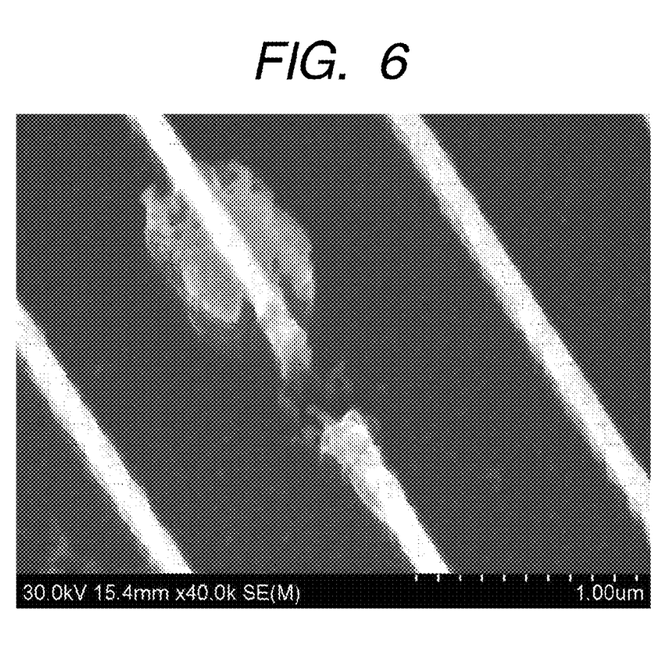
FIG. 6 is the SEM photography of the electric fuse concerning Embodiment 2 of the present invention.
Figure 7:
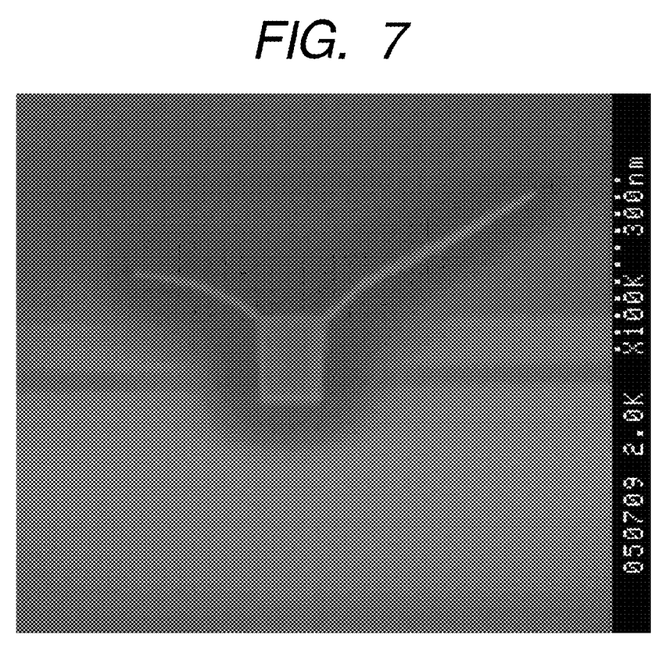
FIG. 7 is the section SEM photography of the electric fuse concerning Embodiment 2 of the present invention.

The SEM photography for a cut section of fuse wiring 1 is shown in FIG. 6, and the section SEM photography for a cut section of fuse wiring 1 is shown in it at FIG. 7. FIG. 6 and FIG. 7 show a state that Cu component of the cut section of fuse wiring 1 which became high temperature has deposited as a Cu crack to the upper oxide film when fuse wiring 1 is cut in high electric current. At FIG. 7, by FIB (Focused Ion Beam) etc., a section is cut from the cut section of fuse wiring 1, and SEM observation is performed.

Cu crack shown in FIG. 6 and FIG. 7 extends by stress application of temperature, bias, etc., and there is a possibility of having a bad influence on the reliability of a semiconductor integrated circuit. Cu which dispersed on the outskirts at the time of cutting of fuse wiring 1 may be diffused around a fuse, may cause metallic contamination, and may cause the malfunction of a nearby transistor etc.

Figure 8:
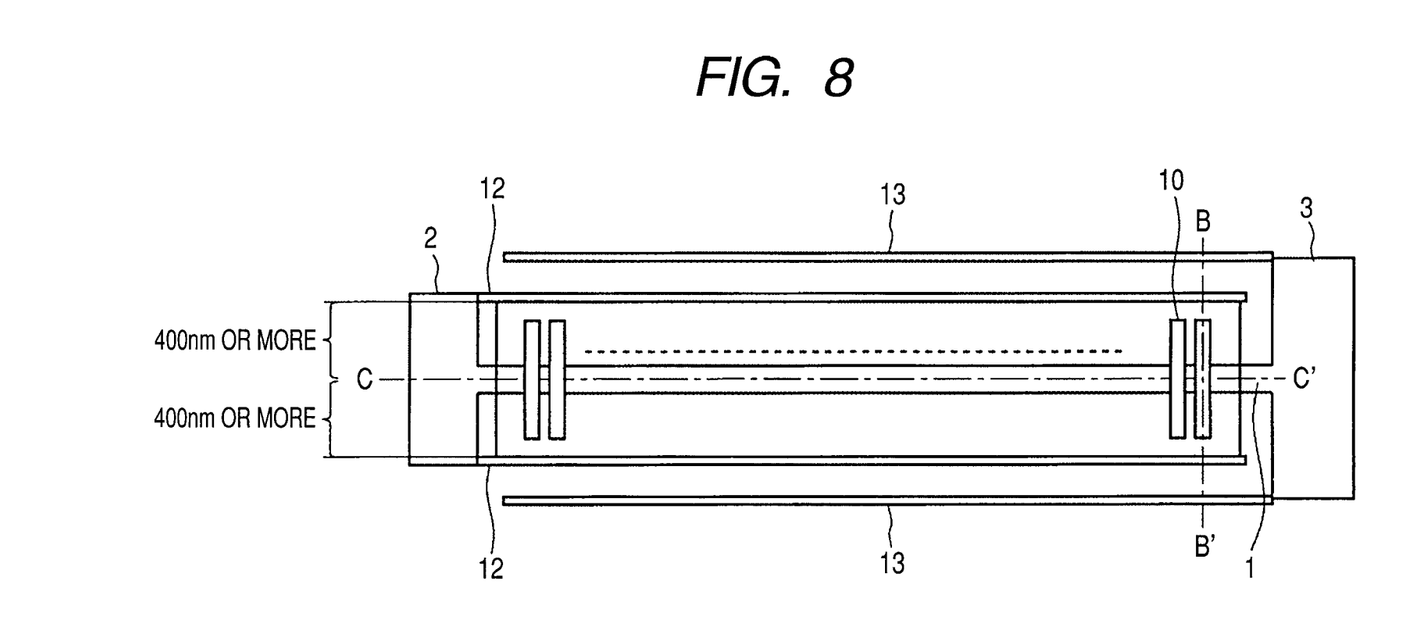
FIG. 8 is a plan view of the electric fuse concerning Embodiment 2 of the present invention.
Figure 9:
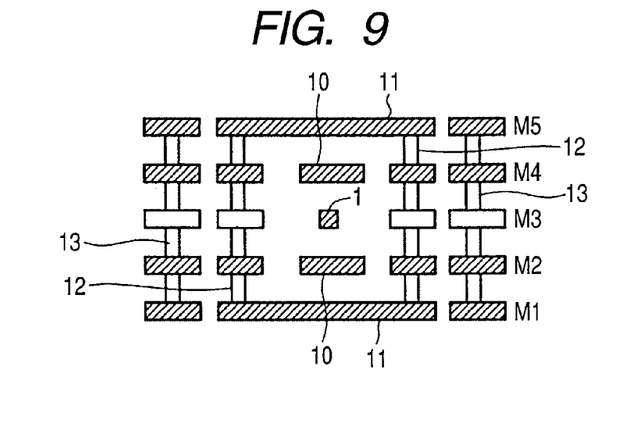
FIGS. 9 and 10 are cross-sectional views of the electric fuse concerning Embodiment 2 of the present invention.
Figure 10:
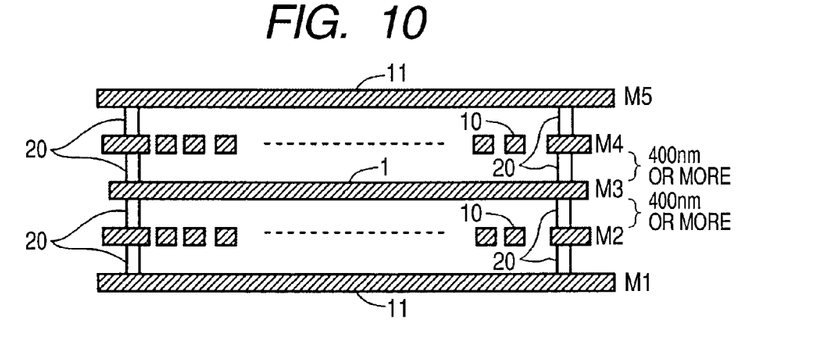

So, with the electric fuse concerning this embodiment, crack expansion prevention layer 10 shown in FIG. 8 through FIG. 10 as crack expansion preventive measures is formed. This crack expansion prevention layer 10 arranges many wirings about width 0.10 μm in parallel to the short side of fuse wiring 1 as crack progress prevention layer 10 in the up-and-down layer (at the layer structure shown in FIG. 3, they are M2 layer and M4 layer) of fuse wiring 1, as shown in FIG. 9 or FIG. 10. That is, crack expansion prevention layer 10 forms the discontinuous layer to the wiring direction of fuse wiring 1. Since this crack expansion prevention layer 10 is formed in a wiring layer, it is formed with wiring materials, such as Cu.

FIG. 8 shows the plan view of the electric fuse concerning this embodiment. And the cross-sectional view in a B-B' surface of the electric fuse shown in FIG. 8 is FIG. 9, and the cross-sectional view in a C-C' surface of the electric fuse shown in FIG. 8 is FIG. 10. The description of M1-M5 shown in right-hand side at FIG. 9 and FIG. 10 corresponds with the layer structure shown in FIG. 3.

With the electric fuse concerning this embodiment, pollution-control layer 11, and via hole wirings 12 and 13 shown in FIG. 8 through FIG. 10 are formed as measures against metallic contamination by Cu scattering of fuse wiring 1. This pollution-control layer 11 is formed in the further upper layer (at the layer structure shown in FIG. 3, it is M5 layer), and a further lower layer of crack expansion prevention layer 10 (at the layer structure shown in FIG. 3, it is M1 layer) platy, as shown in FIG. 9 or FIG. 10. And via hole wiring 12 is formed so that an M5 layer pollution-control layer 11 and M1 layer pollution-control layer 11 may be connected and fuse wiring 1 may be surrounded.

With the electric fuse concerning this embodiment, as shown in FIG. 8 or FIG. 9, via hole wiring 13 is formed in the outside of via hole wiring 12 to fuse wiring 1. It means that this had formed the double pollution-control layer to the horizontal direction of fuse wiring 1 with the electric fuse concerning this embodiment. Via hole wirings 12 and 13 are wirings which connect the wiring layer from M5 layer to M1 layer, and are formed with wiring materials, such as Cu.

With the electric fuse concerning this embodiment, one end of via hole wiring 12 approaches electrode pad 2 for feeding power, and the other end of via hole wiring 13 is close to electrode pad 3 for GND supply. Here, that the one end of via hole wiring 12 approaches electrode pad 2 for feeding power means the state where they are approaching to the degree which can prevent dispersed Cu, although an insulating film exists between via hole wiring 12 and electrode pad 2 for feeding power. It is also the same that the other end of via hole wiring 13 approaches electrode pad 3 for GND supply.

Unless it passes through the portion pinched with via hole wiring 12 and via hole wiring 13 passing through between via hole wiring 12 and electrode pads 3 for GND supply, it becomes impossible hereby, for Cu which dispersed by cutting of fuse wiring 1 to come out of an electric fuse. That is, by making via hole wiring 12 and via hole wiring 13 into alternate structure, as shown in FIG. 8, distance until Cu which dispersed results out of an electric fuse is earned, and the reliability of the semiconductor integrated circuit is increased.

With the electric fuse concerning this embodiment, via hole wiring 12 and via hole wiring 13 presupposed that alternate structure like FIG. 8 is taken. However, the present invention may not be restricted to this but may be an alternate structure (a part of via hole wiring 13 touches electrode pad 2 for feeding power physically via an insulating film, and a part of via hole wiring 12 touches electrode pad 3 for GND supply physically via an insulating film) contrary to FIG. 8. In the present invention, via hole wiring 12 and via hole wiring 13 do not necessarily need to become alternate structure. Electrode pad 2 for feeding power and electrode pad 3 for GND supply may be close to the ends of via hole wirings 12 and 13, and do not need to be close.

Figure 11:
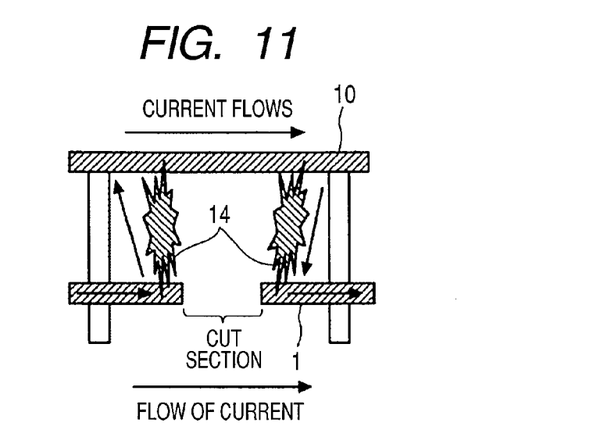
FIGS. 11 and 12 are drawings explaining the relation of the crack expansion prevention layer of an electric fuse and crack concerning Embodiment 2 of the present invention.

Next, crack expansion prevention layer 10 has a structure discontinuous to the wiring direction of fuse wiring 1, as shown in FIG. 8 or FIG. 10. This is for setting it as the structure where the relief rate lowering by short-circuit with crack expansion prevention layer 10 is avoided, and crack expansion can be prevented at the time of cutting of fuse wiring 1. The case of the structure where crack expansion prevention layer 10 is following the wiring direction of fuse wiring 1 at FIG. 11 is shown. Since crack expansion prevention layer 10 is following the wiring direction in FIG. 11 when crack 14 generated into the portion from which fuse wiring 1 was cut touches crack expansion prevention layer 10, fuse wiring 1 which must have been cut will conduct via crack 14 and crack expansion prevention layer 10. Therefore, when crack expansion prevention layer 10 is following the wiring direction of fuse wiring 1, the relief rate of an electric fuse will fall.

Figure 12:
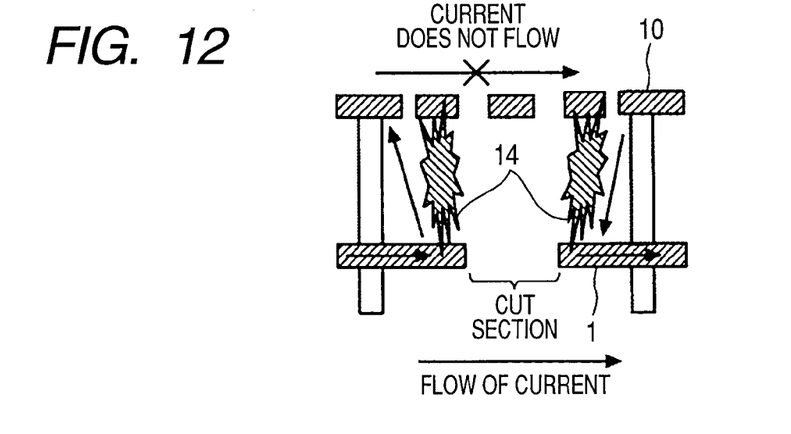

On the other hand, the case of structure with crack expansion prevention layer 10 discontinuous to the wiring direction of fuse wiring 1 is shown in FIG. 12 like this embodiment. In FIG. 12, even if crack 14 generated into the portion from which fuse wiring 1 was cut touches crack expansion prevention layer 10, since crack expansion prevention layer 10 is discontinuous to a wiring direction, it does not conduct via crack 14 and crack expansion prevention layer 10. Therefore, in the case of discontinuous crack expansion prevention layer 10 shown in FIG. 12, crack expansion can be prevented, without the relief rate of an electric fuse falling.

Next, as the electric fuse concerning this embodiment is shown in FIG. 8 and FIG. 10, at least 400 nm or more (in the case of a fine layer, they are two or more layers) of distance of crack expansion prevention layer 10, pollution-control layer 11 and via hole wiring 12, and fuse wiring 1 is opened. Hereby, the electric fuse concerning this embodiment can avoid decline in a relief rate.

Figure 13:
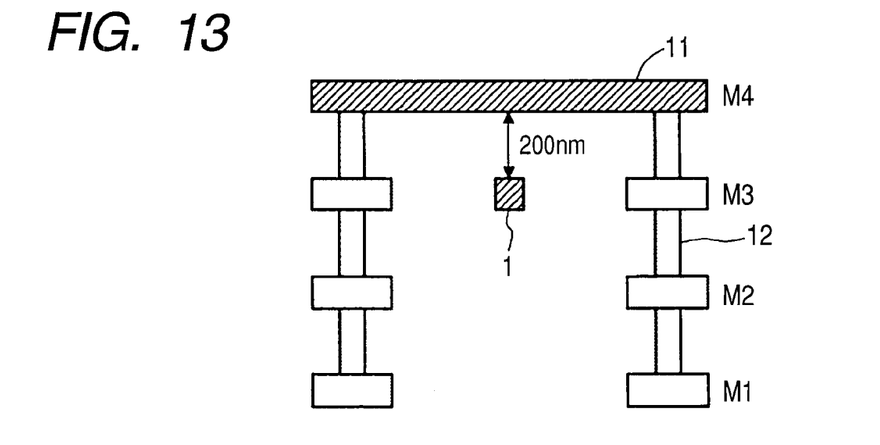
FIGS. 13 to 15 are drawings explaining the distance of the pollution-control layer of an electric fuse and fuse wiring concerning Embodiment 2 of the present invention.
Figure 14:
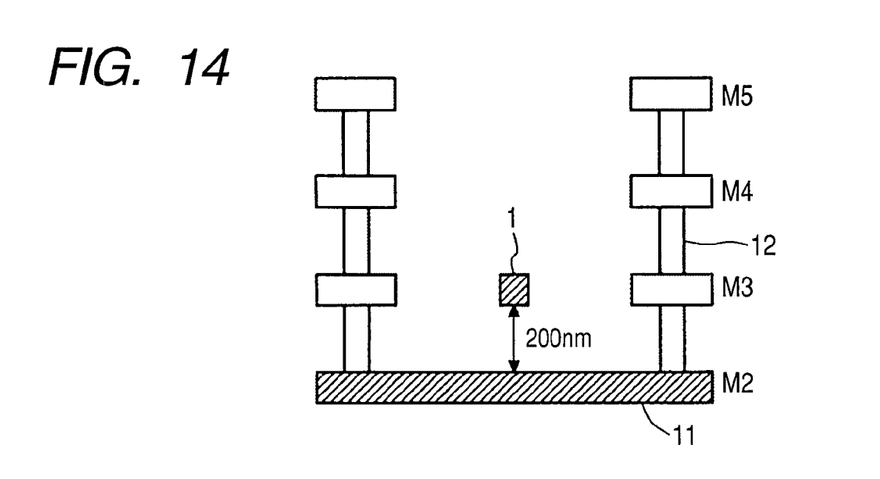
Figure 15:
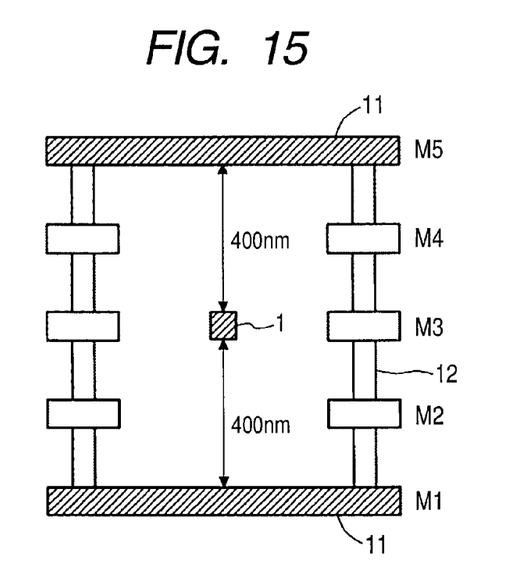

The distance of crack expansion prevention layer 10, pollution-control layer 11 and via hole wiring 12, and fuse wiring 1 is explained concretely. FIG. 13 shows the cross-sectional view of the electric fuse when pollution-control layer 11 is formed in M4 layer and distance with fuse wiring 1 in M3 layer is set to 200 nm. FIG. 14 shows the cross-sectional view of the electric fuse when pollution-control layer 11 is formed in M2 layer and distance with fuse wiring 1 in M3 layer is set to 200 nm. FIG. 15 shows the cross-sectional view of the electric fuse when pollution-control layer 11 is formed in M1 and M5 layers and distance with fuse wiring 1 in M3 layer is set to 400 nm.

Figure 16:
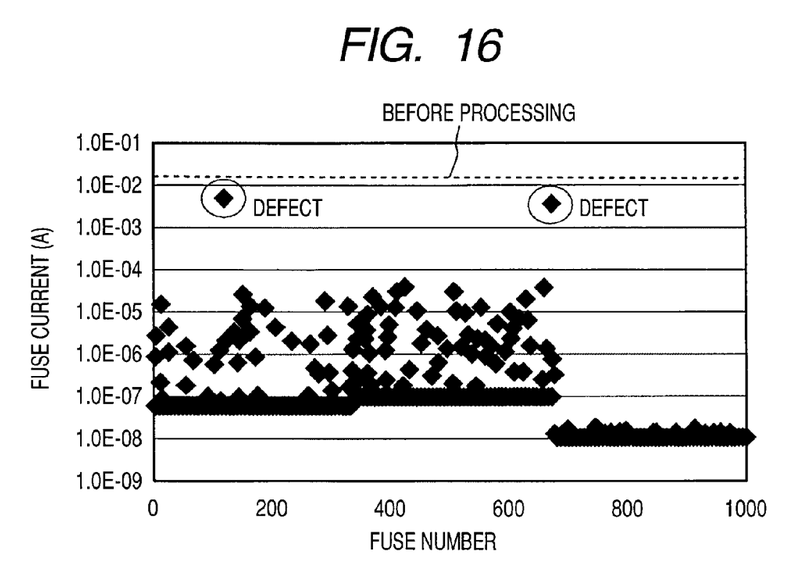
FIGS. 16 to 18 are drawings showing the fuse current before and after the cutting processing of the electric fuse concerning Embodiment 2 of the present invention.
Figure 17:
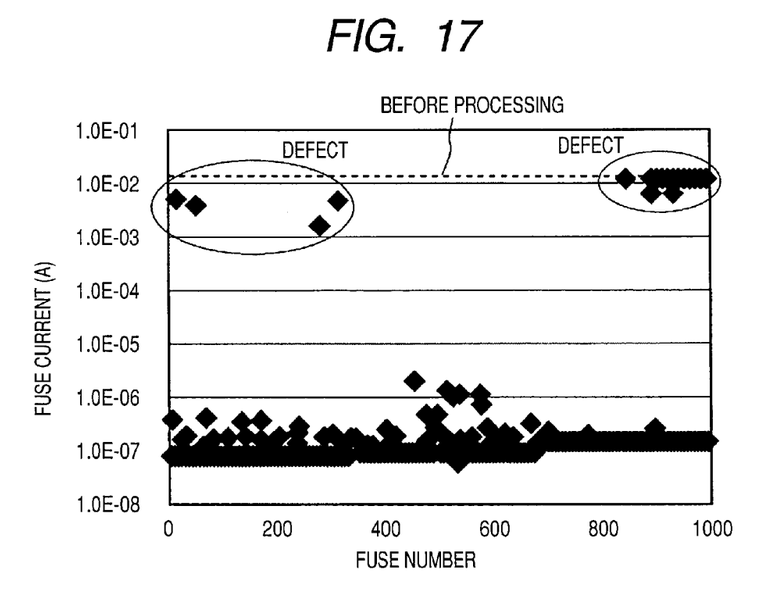
Figure 18:
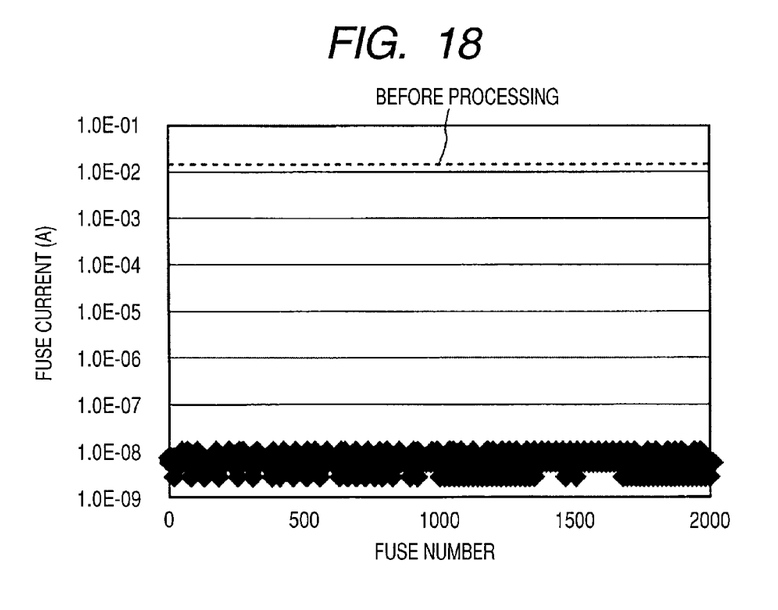

And the result of having measured the fuse current before and after cutting processing (processing which applies the current beyond a predetermined current value for cutting) to the electric fuse of the structure shown in FIG. 13 through FIG. 15 is shown in FIG. 16 through FIG. 18, respectively. 1000 electric fuses of the structure shown in FIG. 13 through FIG. 15 existed, respectively, and the result shown in FIG. 16 through FIG. 18 has measured the fuse current before and after cutting processing to each electric fuse. Therefore, the horizontal axis of FIG. 16 through FIG. 18 constitutes a fuse number to 1-1000.

The result shown in FIG. 16 is the result of using the electric fuse of the structure shown in FIG. 13. Although, as for fuse current, about 0.02 A is flowing before the cutting processing of an electric fuse in the result of FIG. 16, and almost all fuse current is about 1.0E-07A or about 1.0E-08A after the cutting processing of an electric fuse. However, what varies from about 1.0E-04A to about 1.0E-06A, and the thing which has defective cutting which flows in more than 1.0E-03A are included. That is, the result of FIG. 16 means that the relief rate in an electric fuse falls, when the distance of pollution-control layer 11 in M4 layer and fuse wiring 1 is 200 nm.

Similarly, the result shown in FIG. 17 is the result of using the electric fuse of the structure shown in FIG. 14. In the result of FIG. 17, as for fuse current, about 0.02 A is flowing before the cutting processing of an electric fuse. After the cutting processing of an electric fuse, although almost all fuse current is about 1.0E-07A, poor cutting which flows in more than 1.0E-03A is included. That is, the result shown in FIG. 17 means that the relief rate in an electric fuse falls, when the distance of pollution-control layer 11 in M2 layer and fuse wiring 1 is 200 nm.

On the other hand, the result shown in FIG. 18 is the result of using the electric fuse of the structure shown in FIG. 15. In the result of FIG. 18, as for fuse current, about 0.02 A is flowing before the cutting processing of an electric fuse. Almost all fuse current is stable about 1.0E-08A after the cutting processing of an electric fuse. That is, the result shown in FIG. 18 means that the relief rate in an electric fuse does not fall, when the distance of pollution-control layer 11 in M1, M5 layers and fuse wiring 1 is 400 nm.

When pollution-control layer 11 approaches fuse wiring 1 too much from the result shown in FIG. 16 through FIG. 18, the heat generated at the time of the cutting processing of fuse wiring 1 is transmitted to pollution-control layer 11, and escapes, and the temperature of fuse wiring 1 does not reach to a melting point at the time of cutting, but it is thought that poor cutting occurs. Therefore, with the electric fuse concerning this embodiment, in order to make force current into the minimum and to disconnect it stably, it is necessary to keep the distance of pollution-control layer 11 and fuse wiring 1 at at least 400 nm.

When it thinks from a viewpoint which misses the heat generated at the time of the cutting processing of fuse wiring 1, it is necessary to also keep the same the distance of crack expansion prevention layer 10, via hole wiring 12, and fuse wiring 1 at at least 400 nm. Hereby, the electric fuse concerning this embodiment can avoid decline in a relief rate.

Since one layer is about 200 nm when forming the wiring layer shown in FIG. 15 etc. in a fine layer, it is necessary to detach at least two or more layers, and to form crack expansion prevention layer 10 or pollution-control layer 11 from fuse wiring 1.

It was the structure of having formed crack expansion prevention layer 10, and pollution-control layer 11, and via hole wirings 12 and 13 with the electric fuse concerning this embodiment as shown in FIG. 8. However, the present invention is not restricted to this, but as long as the pollution control by scattering of a wiring material can be disregarded, it may form only crack expansion prevention layer 10. In the present invention, as long as crack expansion can be disregarded, only pollution-control layer 11, and via hole wirings 12 and 13 may be formed.

(Embodiment 3)

In Embodiment 2, as shown in FIG. 10, pollution-control layer 11 is provided as measures against metallic contamination by Cu scattering of fuse wiring 1. This pollution-control layer 11 is formed in the further upper layer of crack expansion prevention layer 10 (at the layer structure shown in FIG. 3, it is M5 layer), and a further lower layer (at the layer structure shown in FIG. 3, it is M1 layer) platy via member 20.

As fuse wiring 1 is shown in FIG. 16 through FIG. 18, in order to obtain the characteristics of an electric fuse in the case of the structure shown in FIG. 10, it was a premise that at least one of member 20 between fuse wiring 1 and crack expansion prevention layer 10 and members 20 between crack expansion prevention layer 10 and pollution-control layer 11 is insulated. As a method of securing insulation of member 20, when using an insulating material for the material of member 20 itself, it may not be restricted, but the structure of forming an insulating film between member 20 and pollution-control layer 11 etc. may be used.

Figure 19:
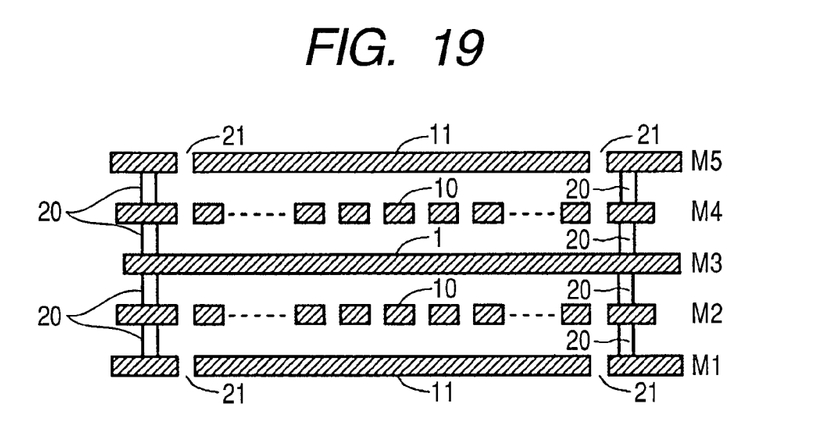
FIGS. 19 and 20 are cross-sectional views of the electric fuse concerning Embodiment 3 of the present invention.

On the other hand, with the electric fuse concerning this embodiment, as shown in FIG. 19, cut section 21 is formed in pollution-control layer 11 between members 20. Here, in pollution-control layer 11 between members 20, it is pollution-control layer 11 located by left-hand side member 20 from member 20 of the right-hand side in a drawing, and pollution-control layer 11 of the position corresponding to fuse wiring 1 which functions as an electric fuse is said.

Cut section 21 shown in FIG. 19 is not restricted when cut physically, but it should just electrically be cut. At this embodiment, there is no need of giving insulation to member 20 by forming cut section 21 in pollution-control layer 11. It becomes possible to form member 20 in the same process as via hole wirings 12 and 13 shown in FIG. 9. Therefore, the electric fuse concerning this embodiment simplifies a process, and has the characteristic effect of reducing cost.

Figure 20:
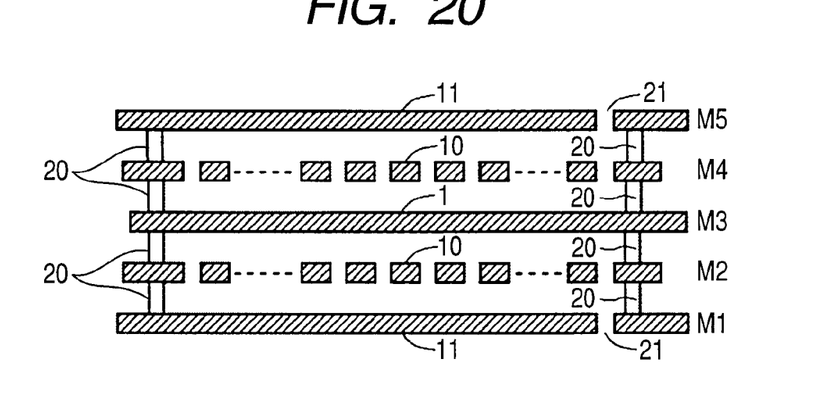

Cut section 21 shown in FIG. 19 was structure which two right and left form to each of pollution-control layer 11 of the upper layer and a lower layer. However, the present invention is not restricted to this, but as shown in FIG. 20, it should just form one cut section 21 in each pollution-control layer 11. With the structure shown in FIG. 20, one cut section 21 is formed at a time in the upper layer and lower layer pollution-control layer 11 of the right-hand side in a drawing. In pollution-control layer 11 of the upper layer and a lower layer, at the same position or at the same side, it is not necessary to form cut section 21.

What is claimed is:

1. A semiconductor integrated circuit device, comprising:
a fuse wiring extending to a first direction and cut by passing beyond a predetermined current value;
a first electrode pad connected to one side of the fuse wiring;
a second electrode pad connected to the other side of the fuse wiring;
a first multilayer structure including first vias and first wirings connected with each other, the multilayer structure extending in the first direction of a planar view;
a second multilayer structure including second vias and second wirings connected with each other, the second multilayer structure extending in the first direction;
a third multilayer structure including third vias and third wirings connected with each other, the third multilayer structure extending in the first direction; and a fourth multilayer structure including fourth vias and fourth wirings connected with each other, the fourth multilayer structure extending in the first direction, wherein the fuse wiring is disposed between the first multilayer structure and the second multilayer structure in a second direction of a planar view perpendicular to the first direction, wherein the fuse wiring, the first multilayer structure and the second multilayer structure are disposed between the third multilayer structure and the fourth multilayer structure in the second direction, wherein a first edge of the first multilayer structure diposed on a side of the first electrode pad and a second edge of the second multilayer structure disposed on the side of the first electrode pad are connected to the first electrode pad, wherein a third edge of the third multilayer structure disposed on a side of the second electrode pad and a fourth edge of the fourth multilayer structure disposed on the side of the second electrode pad are connected to the second electrode pad, wherein a fifth edge of the first multilayer structure disposed on the side of the second electrode pad and a sixth edge of the second multilayer structure disposed on the side of the second electrode pad are not connected to the second electrode pad, and wherein a seventh edge of the third multilayer structure disposed on the side of the first electrode pad and an eighth edge of the fourth multilayer structure disposed on the side of the first electrode pad are not connected to the first electrode pad.

2. A semiconductor integrated circuit device according to claim 1,
wherein a width of the first electrode pad in the second direction is smaller than a width of the second electrode pad in the second direction.

3. A semiconductor integrated circuit device according to claim 1,
wherein the fuse wiring, the first electrode pad, and the second electrode pad are formed only in a same wiring layer.

4. A semiconductor integrated circuit device according to claim 1,
wherein a fifth wiring is formed in an upper layer of the fuse wiring,
wherein a sixth wiring is formed in a lower layer of the fuse wiring,
wherein the first multilayer structure and the second multilayer structure are connected with the fifth wiring and the sixth wiring, and
wherein the first multilayer structure, the second multilayer structure, the fifth wiring, and the sixth wiring surround the fuse wiring.

* * * * *